(12) United States Patent
Li

(10) Patent No.: US 7,327,177 B2
(45) Date of Patent: Feb. 5, 2008

(54) HARDWARE/SOFTWARE IMPLEMENTATION OF A PWM WITH ENHANCED FEATURES USING A STANDARD MICROPROCESSOR

(75) Inventor: Qiong M. Li, Cortlandt Manor, NY (US)

(73) Assignee: Koninklijke Philips Electronics NV, Eindhoven (NL)

( * ) Notice: Subject to any disclaimer, the term of this patent is extended or adjusted under 35 U.S.C. 154(b) by 284 days.

(21) Appl. No.: 10/537,577

(22) PCT Filed: Nov. 25, 2003

(86) PCT No.: PCT/IB03/05396

§ 371 (c)(1),
(2), (4) Date: Jun. 6, 2005

(87) PCT Pub. No.: WO2004/054104

PCT Pub. Date: Jun. 24, 2004

(65) Prior Publication Data

US 2006/0022730 A1 Feb. 2, 2006

Related U.S. Application Data

(60) Provisional application No. 60/432,300, filed on Dec. 10, 2002.

(51) Int. Cl.
*H03K 3/017* (2006.01)
(52) U.S. Cl. .................. 327/175; 327/172
(58) Field of Classification Search .............. None
See application file for complete search history.

(56) References Cited

U.S. PATENT DOCUMENTS

| | | | |
|---|---|---|---|
| 4,599,550 A | 7/1986 | Robertson, Jr. et al. | |
| 5,093,582 A | 3/1992 | Itoh | |
| 5,404,116 A | 4/1995 | Ichihara | |
| 7,126,397 B1 * | 10/2006 | Mok | .......... 327/175 |
| 2002/0180545 A1 | 12/2002 | Bowling | |

* cited by examiner

*Primary Examiner*—Kenneth B. Wells
*Assistant Examiner*—An T. Luu
(74) *Attorney, Agent, or Firm*—Paul Im

(57) ABSTRACT

A method and apparatus is provided to generate a pulse-width modulated (PWM) with enhanced features in accordance with a pre-determined protocol using a standard microprocessor. The method and apparatus is able to handle both variable on/off-timing control and multiple-event interrupts. The PWM functions of the present invention are implemented by software in the microprocessor that handles not only on/off events controlled by external pins, but is programmable on/off timing as well.

9 Claims, 5 Drawing Sheets

HARDWARE/SOFTWARE IMPLEMENTATION OF A PWM WITH ENHANCED FEATURES USING A STANDARD MICROPROCESSOR

CROSS REFERENCE TO RELATED APPLICATION

This application claims the benefit of U.S. provisional application Ser. No. 60/432,300 filed Dec. 10, 2002, which is incorporated herein by reference.

The present invention relates to pulse-width-modulation (PWM) waveform generators. More particularly, the present invention relates to an intelligent, programmable PWM generator with enhanced features implemented using standard modules in a microprocessor. The PWM of the present invention is able to handle both variable on/off-timing control and multiple-event interrupts.

A PWM control signal is widely used in power converters with a PWM control to turn on and off power switches. Examples of PWM generators include: a hardware-implemented, duty-cycle-modulated PWM, as illustrated in FIG. 1; a current control circuit with critical-boundary modulation, as illustrated in FIG. 2; and, a software-controlled PWM generator with programmable on and off periods, as illustrated in FIG. 5.

A simple PWM generator circuit with a variable pulse-width and fixed-period control is illustrated in FIG. 1. The control-signal waveforms are illustrated in FIG. 2. The inputs to the circuit consist of one saw-toothed signal, Vsaw, and a reference voltage, Verr, which is a fixed voltage for an open-loop circuit and an error voltage from the output of a compensation network for a closed-loop circuit. The PWM signal becomes low when the saw-toothed voltage reaches Verr as illustrated in FIG. 2. The pulse-width of the PWM is controlled by Verr.

A PWM generator of critical boundary control with peak-current-detect off and zero-current-detect on is illustrated in FIG. 3. The control waveforms are illustrated in FIG. 4. The PWM becomes low when a peak current is detected and the PWM becomes high again when a zero current is detected (ZCD). The PWM can have a variable pulse-width and period.

In addition to PWM generators with hardware implementation in conventional analog circuits, a commonly used PWM generator available in many microprocessors is illustrated in FIG. 5. The microprocessor calculates the switching period and on-time of the PWM signal and pre-loads the counter registers before the next period. The output of a PWM generator is illustrated in FIG. 6. However, in the implementation illustrated, the software cannot handle the external on or off signal as a regular control signal (e.g. in each period continuously).

Many applications require combined features from known PWM generators. For example, in existing peak current mode controlled circuits, the PWM can be forced off by a peak current detection, forced-on by a zero current detection while at the same time a maximum on time, minimum off time, and maximum off time must be satisfied.

Another example of an application requiring combined features of known PWM generators is a digital-controlled circuit that requires two-mode operations depending on load conditions—e.g. current mode control under a heavy load and voltage mode control under a light load. In a current mode control, the on and off is controlled by external forced on and forced off, in voltage mode control, the on and off is calculated by a software in a microprocessor with a programmable on and off timing.

Another example is a power factor-correction circuit with programmable on-time and zero detection off-time control.

FIG. 7 illustrates a block diagram of a standard timer. Two parameters are preloaded in the timer: period and compare value. The timer automatically reloads timing parameters when the previous counted period is reached or a reload command is sent from the software. The timer starts counting when the counter is preloaded and the enable signal is high. An interrupt signal can be generated when the compared value is reached or the period value is reached. FIG. 8 illustrates the output waveform of the standard timer illustrated in FIG. 7.

None of the prior art PWM devices provides this combination of features in a digitally-controlled circuit using a microprocessor.

Thus, a PWM generator is needed with enhanced features that are implemented in a microprocessor with a software and having standard hardware peripherals. The PWM functions of the present invention are implemented by a software in a microprocessor that handles not only on or off events controlled by external pins, as in FIGS. 1 and 3, but is also programmable on and off timing as illustrated in FIG. 5.

A block diagram of a generic PWM generator according to a preferred embodiment of the present invention has on/off time control and multiple-event on/off actions as illustrated in FIG. 9. In this preferred embodiment, the PWM function with enhanced features uses standard modules in a microprocessor and is implemented by a hardware/software interaction in a microprocessor. No extra hardware is needed in the implementation. The number of force-on and force-off events depends on application requirements and the number of pins can be more than the two pins that are illustrated in FIG. 9.

FIG. 3 illustrates a control circuit with peak current off and zero current on.

Figure 10:
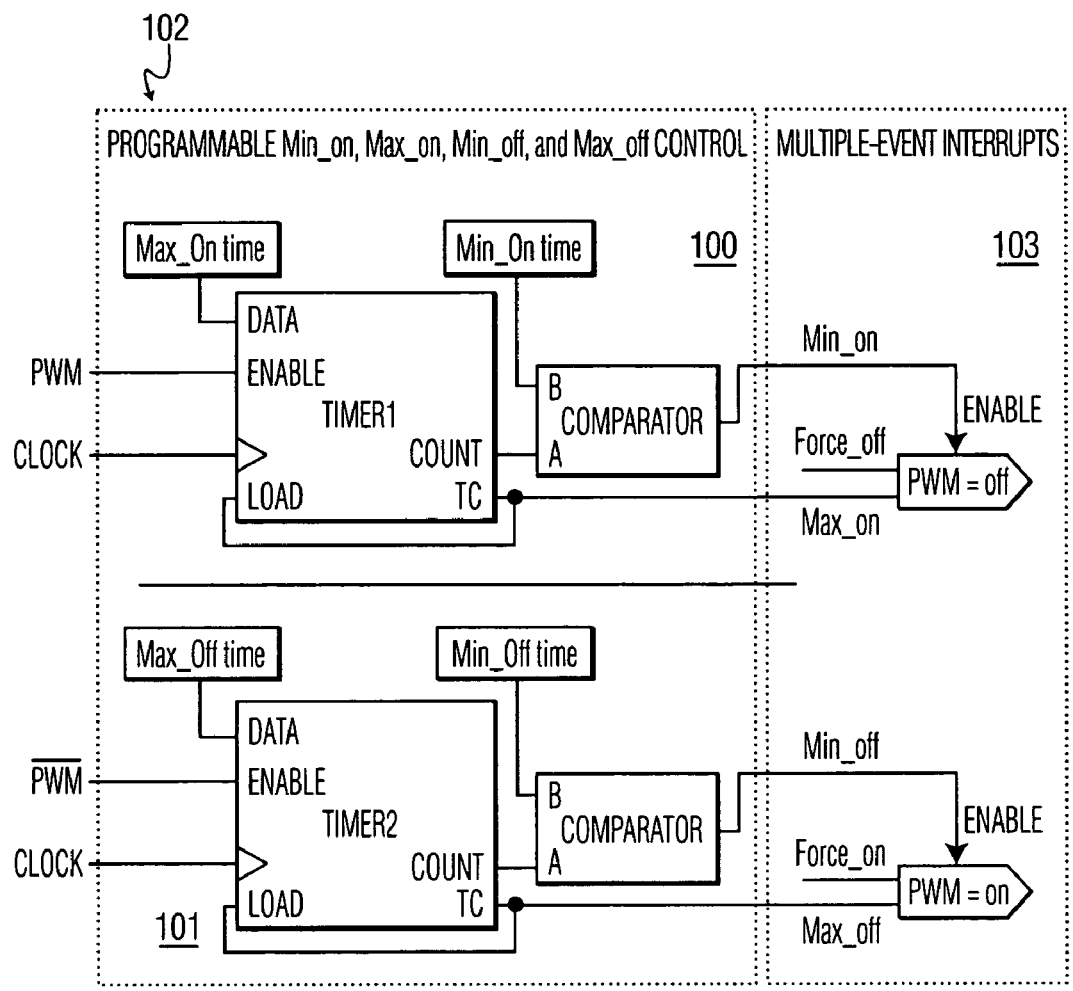
FIG. 10 illustrates a block diagram of a PWM generator using standard units having enhanced features, according to an embodiment of the present invention.

An implementation block diagram of a PWM according to a preferred embodiment of the present invention is illustrated in FIG. 10. As illustrated, the PWM generator of the present invention has two parts: a programmable on-and-off-control part 102 and a multiple-event-interrupts part 103. The programmable on-off-control part 102 is implemented by a first and second standard timer in a microprocessor. The multiple-event-interrupts part 103 is implemented by multiple interrupt routines in the software. The programmable PWM generator is controlled by hardware/software interactions.

In a preferred embodiment of the present invention, the two standard timers that are used in the programmable on-off-control part 102 are used for an on-time control 100 and an off-time control 101. These two controls function alternatively. The on-time control 100 is enabled when the PWM is high and the off-time control 101 is enabled when the PWM is low. The on-time control 100 sets the PWM to low when the min_on time is exceeded and either a force_off or a max_on event is triggered. The off-time control sets the PWM to high when the min_off time is exceeded and either a force_on or a max_off event is triggered. The timing parameters are pre-loaded in the inactive control when the other control is active, so there is no delay involved in this loading process.

Figure 1:
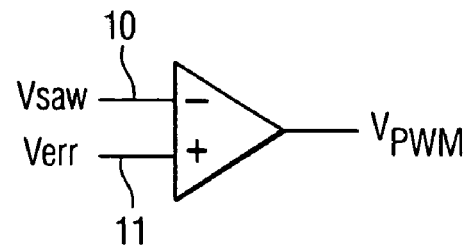
FIG. 1 illustrates a simple variable pulse-width and fixed-period control circuit.
Figure 2:
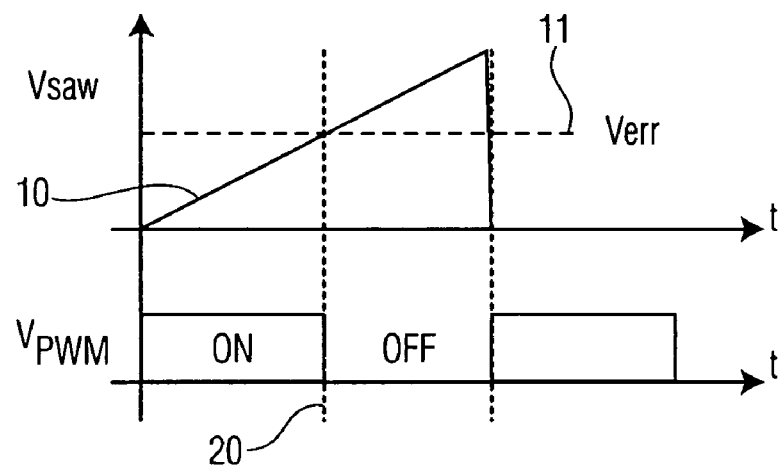
FIG. 2 illustrates control waveforms with a circuit illustrated in FIG. 1.
Figure 3:
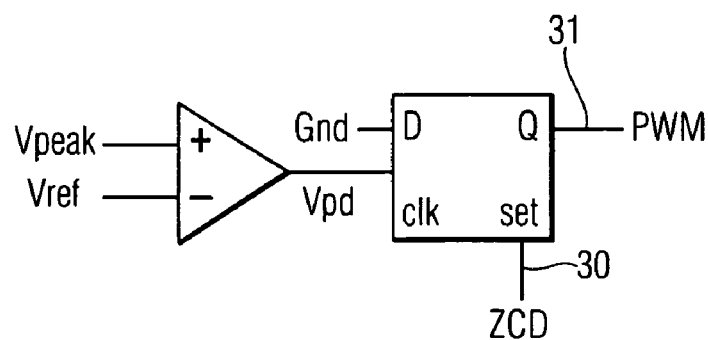
Figure 4:
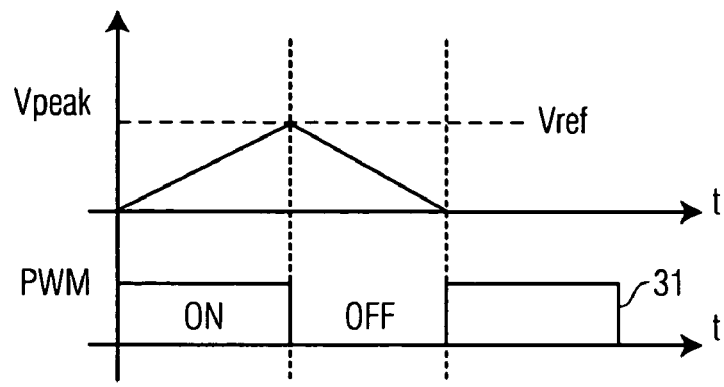
FIG. 4 illustrates control-signal waveforms with the circuit illustrated in FIG. 3.
Figure 5:
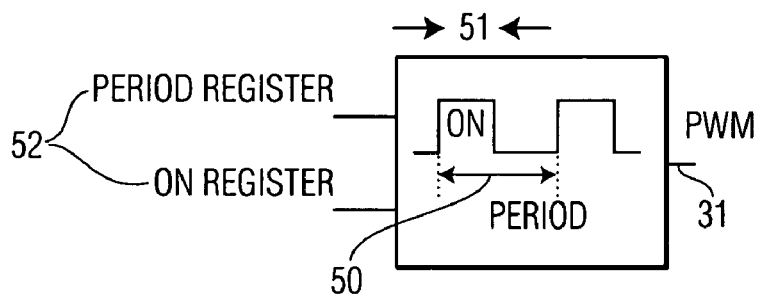
FIG. 5 illustrates a block diagram of a commonly-used PWM generator in MCU.
Figure 6:
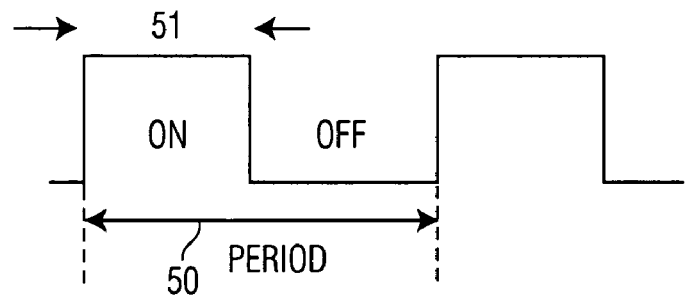
FIG. 6 illustrates the PWM output waveform of the generator illustrated in FIG. 5.
Figure 7:
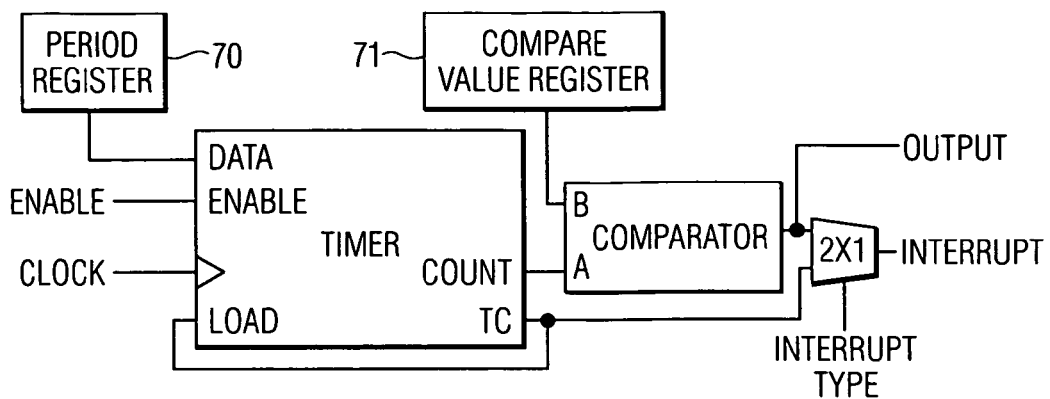
FIG. 7 illustrates a block diagram of a standard timer.
Figure 8:
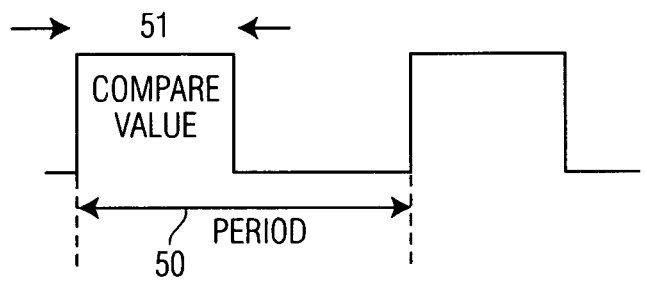
FIG. 8 illustrates the output of a standard timer.
Figure 9:
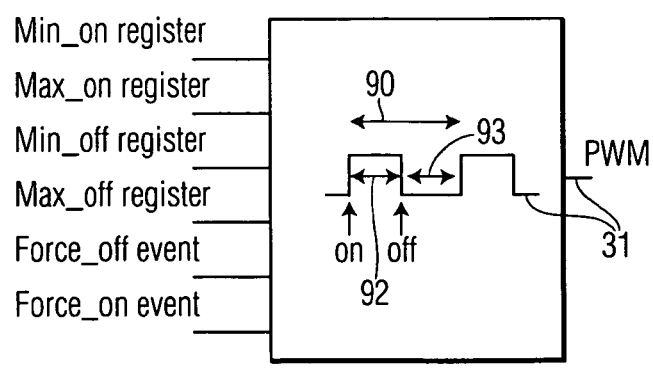
FIG. 9 illustrates a block diagram of a generic PWM generator with on and off time controls and multiple-event interrupts.

FIG. 9 is a block diagram of a generic PWM according to the present invention. Illustrated are four registers and two events that can be externally or programmatically controlled (Force_on and Force_off). A pre-determined protocol for a PWM is the on-off pulse and period width(s) and the order of producing these on/off pulses, e.g., a specification for a series of pulses having a given width and period. For example, the period 90 is determined by the value of the Max_on register and the Max_off register or (Max_on register+Max_off register). The on-width 92 is determined by the value of the Max_on register. The off width 93 is determined by the value of the Max_off register. In a given protocol, Force_on and Force_off events can override the register values to a certain extent within a minimum on and maximum on, and minimum off and maximum off period, as illustrated in FIG. 11.

Figure 11:
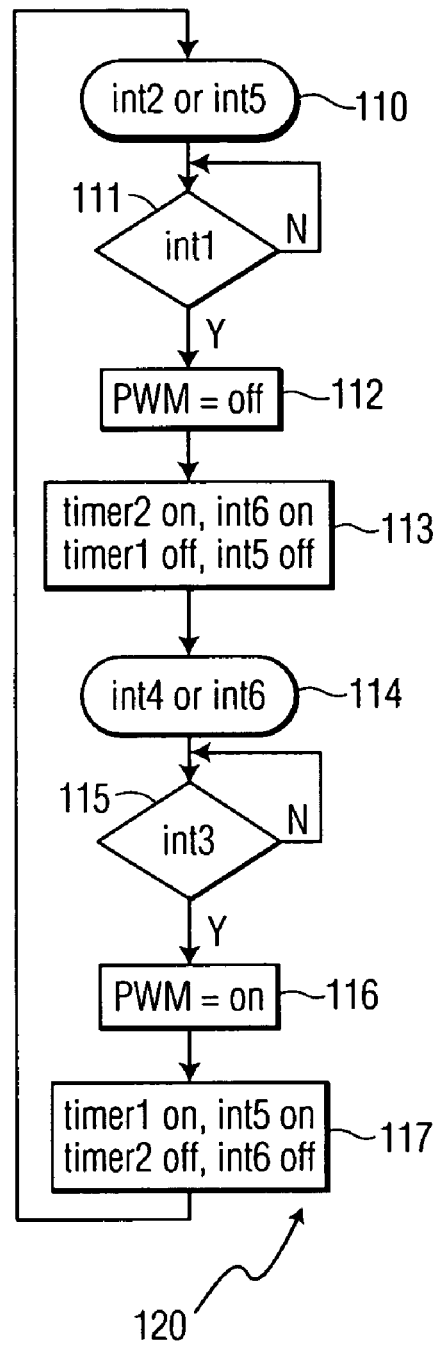
FIG. 11 illustrates a flow chart of multiple-event interrupts for a PWM generator.

FIG. 11 illustrates a flow chart 120 of a preferred embodiment of the multiple-event-interrupts part 103 that implements a pre-determined protocol for a series of on/off pulses that is produced by a PWM generatorError! Reference source not found. The interrupts associated with this pre-determined protocol are implemented by interrupt-handling software routines resident in a microprocessor. In the preferred embodiment of the programmable on/off control 118, illustrated in FIG. 11, four timer registers are provided 118 two for the timer 1 and the timer 2. Six events can be triggered 119: four by the programmable on/off control software and two externally. Keeping in mind that the timers are active alternately—meaning that the performance of a and b below alternates—in a preferred embodiment, the flow of processing by the multiple-event interrupts processor 103 is as follows:

a. If either a force_off action occurs (int5 is triggered) or timer1 has been on longer than Tmax_on (int2 is triggered) then int1 is tested at step 111 until it is triggered by the compare value reaching Tmin_on. Then, at step 112 the PWM is set to low or off. Following step 112, at step 113 timer2 is turned on, timer 1 is turned off, int6=force_on is enabled, and int5=force_off is disabled.

b. If either a force_on action occurs (int6 is triggered) or timer2 has been off longer than Tmax_off (int4 is triggered), then int3 is tested at step 115 until it is triggered by the compare value reaching Tmin_off. Then, at step 116 the PWM is set to high or turned on. Following step 116, at step 117 timer1 is turned on, timer 2 is turned off, int5=force_off is enabled, and int6=force_on is disabled.

When some of the events are not required by an application, those events can be disabled easily in the software.

The PWM implementation of a preferred embodiment of the present invention employs standard peripherals of a microprocessor without requiring any special units or extra hardware thus providing maximum flexibility as a PWM generator.

The PWM of a preferred embodiment has the following features:
Programmable min-on control
Programmable max-on control
Programmable min-off control
Programmable max-off control
Multiple force-off events control, programmable or external
Multiple force-on events control, programmable or external
On/off timing can involve all or some of the parameters or events above.
All events can be triggered in every PWM period continuously
No delay time for pre-loading timer registers While the invention has been explained with reference to specific embodiments of the invention, the explanation is presented by way of illustration only and not in any limiting sense. The invention scope is not restricted to the software and hardware structure described above but includes various modifications and variations that would be apparent to one skilled in the art. Such variations are not to be regarded as a departure from the spirit and scope of the invention, and all such modifications are intended to be included within the scope of the following claims.

The invention claimed is:

1. A PWM waveform-generator apparatus in which a series of pre-determined pulse widths are modulated in accordance with a pre-determined protocol, comprising:
    means for generating a plurality of on/off timing-based interrupts;
    means for generating a force on/off action-based interrupt having a programmable control;
    means for generating a force on/off action-based interrupt having an external control; and,
    means for interpreting said generated plurality of timing-based interrupts and said at least one action-based interrupt such that the series of pulse widths of the PWM waveform generator are modulated in accordance with said protocol.

2. The PWM waveform-generator apparatus of claim 1, wherein:
    the means for generating a plurality of on/off timing-based interrupts is a programmable on-off-control part;
    the means for generating a force on/off action-based interrupt having a programmable control is the programmable on-off control part;
    the means for generating a force on/off action-based interrupt having an external control is selection from the group consisting of an external force_on action and an external force_off action; and,
    the interpreting means is a multiple-event-interrupts part comprising a software interrupt routine for handling each timing-based and action-based interrupt.

3. The PWM waveform generator apparatus of claim 2, wherein said programmable on-off-control part comprises:
    an on-time control comprising a first timer and a first comparator; and
    an off-time control comprising a second timer and second comparator, wherein the on-time control is enabled for a first period and the off-time control is disabled when the PWM is high and the off-time control is enabled for a second period and the on-time control is disabled when the PWM is low, such that the first and second control are alternately enabled and disabled.

4. The PWM waveform generator apparatus of claim 3, wherein:

for on/off timing said protocol comprises at least one of:
  a programmable on-pulse width Min_on parameter control,
  a programmable on-period Max_on parameter control,
  a programmable off-pulse width Min_off parameter control,
  a programmable off-period Max_off parameter control,
  at least one event control selected from a programmable event control for triggering a force-off event and an external event control for triggering a force-off event,
  at least one event control selected from a programmable event control for triggering a force-on event and an external event control for triggering a force-on event,
wherein at least one of a force-on event and a force-off event can be triggered in an on-period and in an off-period.

5. The PWM waveform-generator apparatus of claim 4, wherein:

the first timer and second timer respectively comprises a first and third register;
the first and second comparator respectively comprises a second and fourth register;
wherein, when the on-time control is enabled,
  a. the second register has been pre-loaded by the on-time control with a compare value equal to a pre-determined minimum on-width (minimum on-time Min_on) of the PWM, the first register has been pre-loaded with a predetermined maximum on-width (maximum on-time Max_on) of the PWM such that there is no delay time for loading said first and second register,
  b. a first interrupt is triggered by the first comparator when the second register equals the compare value and a second interrupt is triggered by the first timer when the first register equals a pre-determined first period, at least one action-based interrupt can be triggered at least once during one period of the PWM according to the pre-determined protocol, thereby turning off the PWM by the on-time control when at least one of the second interrupt and the at least one action-based interrupt is triggered and the first interrupt is triggered, and
when the off-time control is enabled
  c. the fourth register has been pre-loaded with a compare value equal to a pre-determined minimum off-width (minimum off-time Min_off) of the PWM, the third register has been pre-loaded with a predetermined maximum off-width (maximum off-time Max_off) of the PWM such that there is no delay time for loading said third and fourth register, d. a third interrupt is triggered by the second comparator when the fourth register equals the compare value and a fourth interrupt is triggered by the second timer when the third register equals the pre-determined second period, at least one action-based interrupt can be triggered at least once during one period of the PWM according to the pre-determined protocol, thereby turning on the PWM by the off-time control when at least one of the fourth interrupt and theat least one action-based interrupt is triggered and the third interrupt is triggered.

6. A microprocessor for performing the programmable on-off control and the software interrupt routines as claimed in claim 2.

7. A method of programmable control of a PWM generator in which a signal is modulated as a series of on/off pulses each having a width and a period in accordance with a pre-determined protocol, comprising the steps of:

providing a pre-determined protocol for a series of pulse widths and periods;
generating a plurality of on/off timing-based interrupts in accordance with the provided protocol;
generating at least one force on/off action-based interrupt in accordance with the provided protocol;
interpreting said generated plurality of timing-based interrupts and said at least one action-based interrupt in accordance with said protocol.

8. The method of claim 7, wherein:

the step of generating a plurality of on/off interrupts further comprises the steps of:
  a. providing a programmable-on-off-control part, and
  b. controlling the generation of said plurality of on/off timing-based interrupts by the provided programmable on-off control part;
the step of generating at least one force on/off action-based interrupt further comprises at least one of the steps of:
  c. generating the at least one force on/off action-based interrupt by the provided programmable on-off control part;
  d. performing the substeps of:
    1. providing an external control for the generation of the at least one force on/off action-based interrupt; and
    2. generating the at least one force on/off action-based interrupt by the provided external control.

9. The method of claim 8, wherein the interpreting step further comprises the steps of:

e. providing a multiple event-interrupts part; and
f. controlling the interpretation of at least one action-based interrupt by the provided multiple event-interrupts part.

* * * * *